US011232942B2

(12) United States Patent
Yang et al.

(10) Patent No.: US 11,232,942 B2
(45) Date of Patent: Jan. 25, 2022

(54) SUBSTRATE TREATING METHOD AND SUBSTRATE TREATING APPARATUS

(71) Applicants: SEMES CO., LTD., Chungcheongnam-do (KR); SEOUL NATIONAL UNIVERSITY R&DB FOUNDATION, Seoul (KR)

(72) Inventors: Seungtae Yang, Gyeonggi-do (KR); Buyoung Jung, Chungcheongnam-do (KR); Gui Su Park, Chungcheongnam-do (KR); Jae Hong Lee, Gyeonggi-do (KR); Ho-Young Kim, Seoul (KR); Yunsuk Jeung, Seoul (KR)

(73) Assignees: SEMES CO., LTD., Chungcheongnam-do (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 15/931,911

(22) Filed: May 14, 2020

(65) Prior Publication Data

US 2020/0365395 A1 Nov. 19, 2020

(30) Foreign Application Priority Data

May 14, 2019 (KR) .......................... 10-2019-0056565

(51) Int. Cl.
*B08B 3/04* (2006.01)
*H01L 21/02* (2006.01)
*H01L 21/67* (2006.01)

(52) U.S. Cl.
CPC .......... *H01L 21/02057* (2013.01); *B08B 3/04* (2013.01); *H01L 21/67253* (2013.01)

(58) Field of Classification Search
CPC ......... H01L 21/02057; H01L 21/67253; H01L 21/67028; H01L 21/67051;
(Continued)

(56) References Cited

U.S. PATENT DOCUMENTS

2001/0047595 A1* 12/2001 Mehmandoust .. H01L 21/67034
34/443
2007/0017555 A1* 1/2007 Sekiguchi ........... H01L 21/6708
134/33
(Continued)

FOREIGN PATENT DOCUMENTS

JP 11-344286 A 12/1999
KR 10-0886860 B1 3/2009
(Continued)

*Primary Examiner* — Alexander Markoff
(74) *Attorney, Agent, or Firm* — Procopio, Cory, Hargreaves & Savitch, LLP (57) ABSTRACT

A method for treating a substrate is provided. The method includes supplying a first treating liquid to a treating target surface of the substrate while the substrate is rotating, and subsequently, supplying a second treating liquid having a surface tension lower than a surface tension of the first treating liquid to the substrate while an evaporation inhibiting agent in a vapor state is present around the first treating liquid supplied to the substrate, such that the first treating liquid on the substrate is substituted with the second treating liquid. Thus, a vapor atmosphere may be formed around a cleaning liquid applied to the substrate. Thus, a liquid-film destroying phenomenon may be prevented in a procedure in which the cleaning liquid is replaced with an organic solvent.

10 Claims, 11 Drawing Sheets

(58) Field of Classification Search
CPC ......... H01L 21/67023; H01L 21/67034; H01L 21/6704; H01L 21/6715; H01L 21/67248; H01L 21/68764; H01L 21/02052; B08B 3/04
See application file for complete search history.

(56) References Cited

U.S. PATENT DOCUMENTS

| | | | | |
|---|---|---|---|---|
| 2008/0093340 | A1* | 4/2008 | Nakamori | H01L 21/67034 216/57 |
| 2009/0081810 | A1* | 3/2009 | Hamada | H01L 21/67051 438/5 |
| 2009/0205684 | A1* | 8/2009 | Orii | H01L 21/02052 134/33 |
| 2014/0065295 | A1* | 3/2014 | Emoto | H01L 21/67051 427/8 |
| 2014/0231012 | A1* | 8/2014 | Hinode | H01L 21/67248 156/345.23 |
| 2016/0035561 | A1* | 2/2016 | Aibara | H01L 21/67028 134/4 |
| 2016/0300727 | A1* | 10/2016 | Hinode | C09K 13/04 |
| 2017/0256392 | A1* | 9/2017 | Maruyama | H01L 21/02057 |
| 2019/0011734 | A1* | 1/2019 | Otsuji | G02F 1/1333 |
| 2019/0035652 | A1* | 1/2019 | Hashimoto | H01L 21/02054 |
| 2019/0067047 | A1* | 2/2019 | Tanizawa | H01L 21/6708 |
| 2019/0295865 | A1* | 9/2019 | Hanawa | H01L 21/67109 |
| 2020/0018549 | A1* | 1/2020 | Hsu | H01L 21/67253 |
| 2020/0075356 | A1* | 3/2020 | Hsu | H01L 21/67028 |
| 2020/0357649 | A1* | 11/2020 | Kawabuchi | F26B 21/10 |

FOREIGN PATENT DOCUMENTS

| | | |
|---|---|---|
| KR | 10-1579507 B1 | 12/2015 |
| KR | 10-2017-0073594 A | 6/2017 |

* cited by examiner

SUBSTRATE TREATING METHOD AND SUBSTRATE TREATING APPARATUS

CROSS-REFERENCE TO RELATED APPLICATIONS

A claim for priority under 35 U.S.C. § 119 is made to Korean Patent Application No. 10-2019-0056565 filed on May 14, 2019 in the Korean Intellectual Property Office, the entire contents of which are hereby incorporated by reference.

BACKGROUND

Embodiments of the inventive concept described herein relates to a substrate treating method and a substrate treating apparatus, and more particularly, to a substrate treating method and a substrate treating apparatus for supplying a liquid to a substrate to treat the substrate using the liquid.

In order to manufacture a semiconductor device, various processes such as photographing, deposition, ashing, etching, and ion implantation are performed. Further, before and after these processes are performed, a cleaning process is performed to clean particles remaining on the substrate.

The cleaning process includes supplying a chemical to a rotating substrate supported on a spin head, supplying a cleaning liquid such as deionized water (DIW) to the substrate to remove the chemical from the substrate, supplying an organic solvent such as isopropyl alcohol (IPA) liquid with a lower surface tension than that of the cleaning liquid to the substrate to replace the cleaning liquid on the substrate with the organic solvent, and removing the substituted organic solvent from the substrate.

Figure 17:
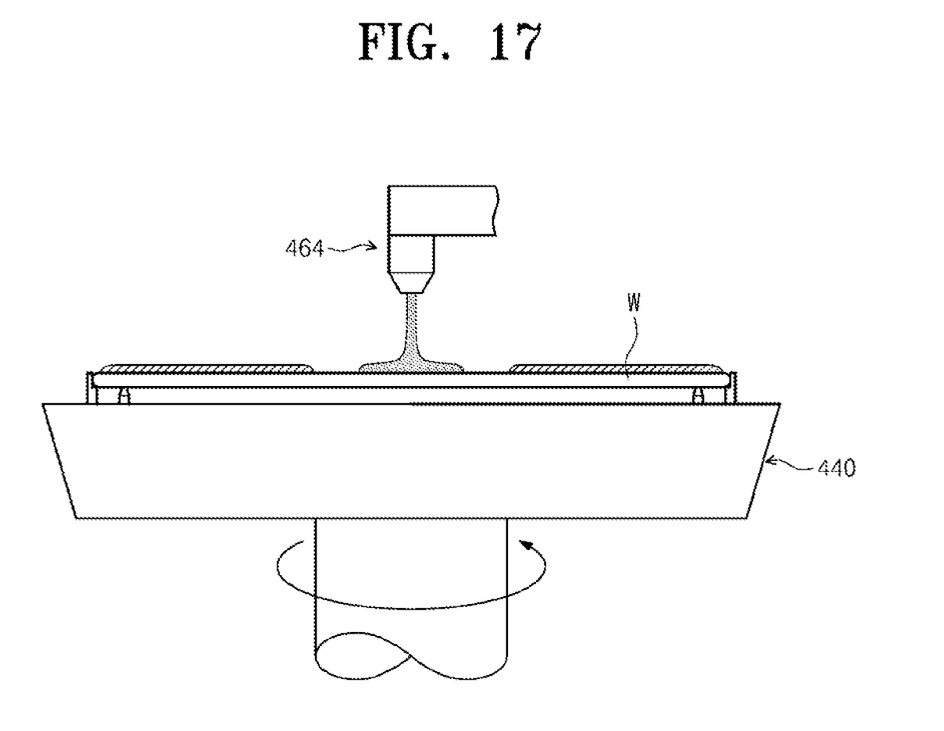
FIG. 17 is a view showing a liquid-film destroying phenomenon occurring in a procedure in which a cleaning liquid is replaced with an organic solvent in a conventional cleaning process.

However, when a large amount of IPA evaporates while replacing the deionized water with the IPA, a liquid-film formed on the substrate is destroyed due to a difference in a surface tension between the organic solvent and the cleaning liquid, as shown in FIG. 17. When the liquid-film is destroyed, drying may occur while an interior of a pattern is not substituted with the organic solvent, such that defects such as leaning and particle contamination occur.

SUMMARY

Embodiments of the inventive concept provide a substrate treating method and apparatus that may improve cleaning efficiency.

Embodiments of the inventive concept provide a substrate treating method and apparatus that prevents a liquid-film from being destroyed in a procedure of replacing a cleaning liquid with an organic solvent.

The purposes of the inventive concept are not limited thereto. Other purposes as not mentioned will be clearly understood by those skilled in the art from following descriptions.

According to an exemplary embodiment, an apparatus for treating a substrate includes a housing having a treating space defined in the housing, a support unit for supporting the substrate in the treating space, a first treating liquid supply unit for supplying a first treating liquid to a treating target surface of the substrate supported on the support unit, a second treating liquid supply for supplying a second treating liquid having a surface tension lower than a surface tension of the first treating liquid to the treating target surface of the substrate supported on the support unit, and a vapor generation adjustment unit for spraying an evaporation inhibiting agent in a vapor state into the treating space.

The apparatus may further include a controller configured to control the first treating liquid supply unit, the second treating liquid supply unit, and the vapor generation adjustment unit, wherein the controller may be configured to control the first treating liquid supply unit, the second treating liquid supply unit, and the vapor generation adjustment unit such that the second treating liquid is supplied to the treating target surface on which the first treating liquid has been present such that the first treating liquid on the treating target surface is replaced with the second treating liquid, and such that the evaporation inhibiting agent in the vapor state is supplied to the treating space before discharge of the second treating liquid.

The first treating liquid may be distilled water (DIW), the second treating liquid may be an organic solvent, and the evaporation inhibiting agent may be water.

A surface tension of the evaporation inhibiting agent may be greater than a surface tension of the second treating liquid.

A surface tension of the evaporation inhibiting agent may be equal to or greater than a surface tension of the first treating liquid.

The evaporation inhibiting agent may be the same type as the first treating liquid.

The second treating liquid may be supplied to the treating target surface while a relative humidity of the evaporation inhibiting agent in the treating space is 100%.

The apparatus may further include a relative humidity measurement device for measuring a relative humidity of the treating space in the housing.

According to an exemplary embodiment, a method for treating a substrate includes supplying a first treating liquid to a treating target surface of the substrate while the substrate is rotating, and subsequently, supplying a second treating liquid having a surface tension lower than a surface tension of the first treating liquid to the substrate while an evaporation inhibiting agent in a vapor state is present around the first treating liquid supplied to the substrate, such that the first treating liquid on the substrate is substituted with the second treating liquid.

A humidity around the first treating liquid may be maintained at 100% while the second treating liquid is being supplied.

A surface tension of the evaporation inhibiting agent may be greater than a surface tension of the second treating liquid.

A surface tension of the evaporation inhibiting agent may be equal to or greater than a surface tension of the first treating liquid.

The evaporation inhibiting agent may be the same type as the first treating liquid.

The first treating liquid may be DIW, the second treating liquid may be an organic solvent, and the evaporation inhibiting agent may be water.

The evaporation inhibiting agent may be supplied before the first treating liquid is supplied, or at the same time when the first treating liquid is supplied, or while the first treating liquid is being supplied.

The evaporation inhibiting agent may be continuously supplied while the second treating liquid is being supplied, or until the supply of the second treating liquid is terminated.

The second treating liquid may be discharged to the substrate while a collision point of the second treating liquid on the substrate changes from a central region of the substrate to an edge region of the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in more detail with reference to the accompanying drawings. The embodiments of the inventive concept may be modified in various forms, and a scope of the inventive concept should not be interpreted as being limited to following embodiments. The embodiments are configured to more fully convey the inventive concept to those of ordinary skill in the art. Therefore, a shape of each of elements in the drawings is exaggerated to emphasize a clearer illustration.

Figure 1:
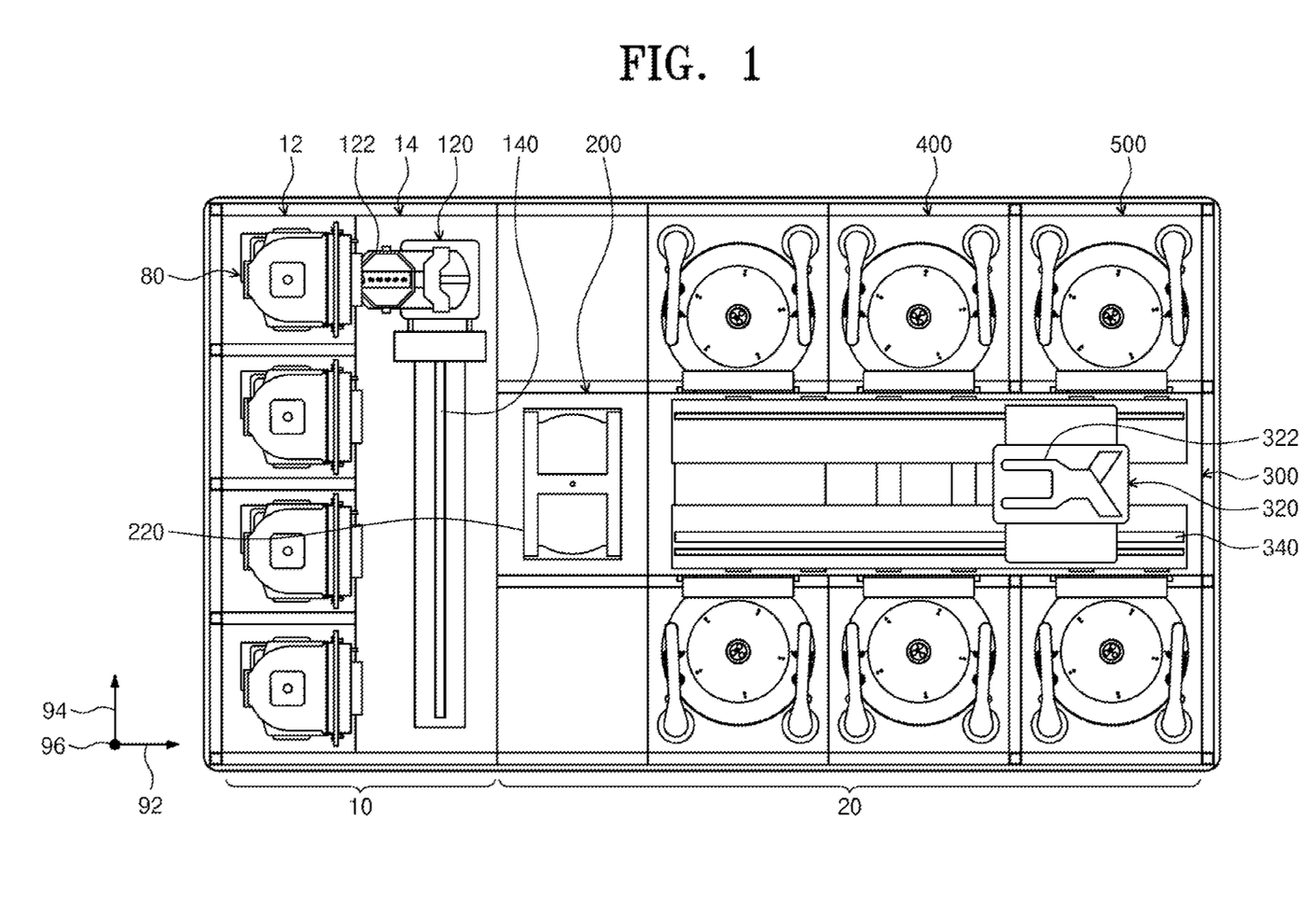
FIG. 1 is a plan view schematically showing a substrate treating apparatus according to one embodiment of the inventive concept.

FIG. 1 is a plan view schematically showing a substrate treating apparatus according to one embodiment of the inventive concept.

Referring to FIG. 1, the substrate treating apparatus includes an index module 10 and a treating module 20. According to one embodiment, the index module 10 and treating module 20 are arranged along one direction. Hereinafter, a direction in which the index module 10 and the treating module 20 are arranged is referred to as a first direction 92. A direction perpendicular to the first direction 92 when viewed above is referred to as a second direction 94. A direction perpendicular to both of the first direction 92 and the second direction 94 is referred to as a third direction 96.

The index module 10 transfers a substrate W from a container 80 receiving therein the substrate W to a treating module 20, and transfers the substrate W which has been treated in the treating module 20 into the container 80. A length direction of the index module 10 is embodied as the second direction 94. The index module 10 has a load port 12, and an index frame 14. The load port 12 is opposite to the treating module 20 around the index frame 14. The container 80 containing therein the substrate W is placed on the load port 12. A plurality of load ports 12 may be provided. The plurality of load ports 12 may be arranged along the second direction 94.

The container 80 may be embodied as a sealing container such as a front surface open pod (FOUP). The container 80 may be placed on the load port 12 by an operator or transportation means such as an overhead transfer, an overhead conveyor, or an automatic guided vehicle.

The index frame 14 has an index robot 120. In the index frame 14, a guide rail 140 having a length direction embodied as the second direction 94 may be disposed. The index robot 120 may be configured to be movable on the guide rail 140. The index robot 120 includes a hand 122 on which the substrate W is placed. The hand 122 may be configured to be able to move forward and backward, rotate about an axis of the third direction 96, and move along the third direction 96. A plurality of hands 122 may be arranged and spaced apart in a vertical direction. Each hand 122 may be configured to move forward and backward independently of each other.

The treating module 20 includes a buffer unit 200, a transfer chamber 300, and a liquid treating chamber 400. The buffer unit 200 provides a space where the substrate W to be brought into the treating module 20 and the substrate W to be taken out from the treating module 20 may temporarily stay. The liquid treating chamber 400 performs a liquid treating process to supplies a liquid to the substrate W to treat the substrate W using the liquid. The transfer chamber 300 transfers the substrate W between the buffer unit 200 and the liquid treating chamber 400.

The transfer chamber 300 may have a length direction of first direction 92. The buffer unit 200 may be placed between the index module 10 and the transfer chamber 300. The liquid treating chamber 400 may be disposed on a side to the transfer chamber 300. The liquid treating chamber 400 and the transfer chamber 300 may be arranged along the second direction 94. The buffer unit 200 may be located adjacent to one end of the transfer chamber 300.

In one example, the liquid treating chambers 400 may be disposed on both sides to the transfer chamber 300 respectively. The liquid treating chambers 400 on one side to the transfer chamber 300 may be arranged in an A×B matrix (each of A and B being a natural number equal to or larger than 1) along the first direction 92 and the third direction 96.

The transfer chamber 300 has a transfer robot 320. In the transfer chamber 300, a guide rail 340 having a length direction of the first direction 92 may be disposed. The transfer robot 320 may be configured to be movable on the guide rail 340. The transfer robot 320 includes a hand 322 on which the substrate W is placed. The hand 322 may be configured to be able to move forward and backward, rotate about an axis of the third direction 96, and move along the third direction 96. A plurality of hands 322 may be arranged and spaced apart in the vertical direction. The hands 322 may be configured to move forward and backward independently of each other.

The buffer unit 200 has a plurality of buffers 220 on which the substrate W is placed. The buffers 220 may be arranged to be spaced apart from each other along the third direction 96. The buffer unit 200 has an open front surface and an open rear surface. The front surface faces the index module 10, and the rear surface faces the transfer chamber 300. The index robot 120 may access the buffer unit 200 through the front surface, and the transfer robot 320 may access the buffer unit 200 through the rear surface.

Figure 2:
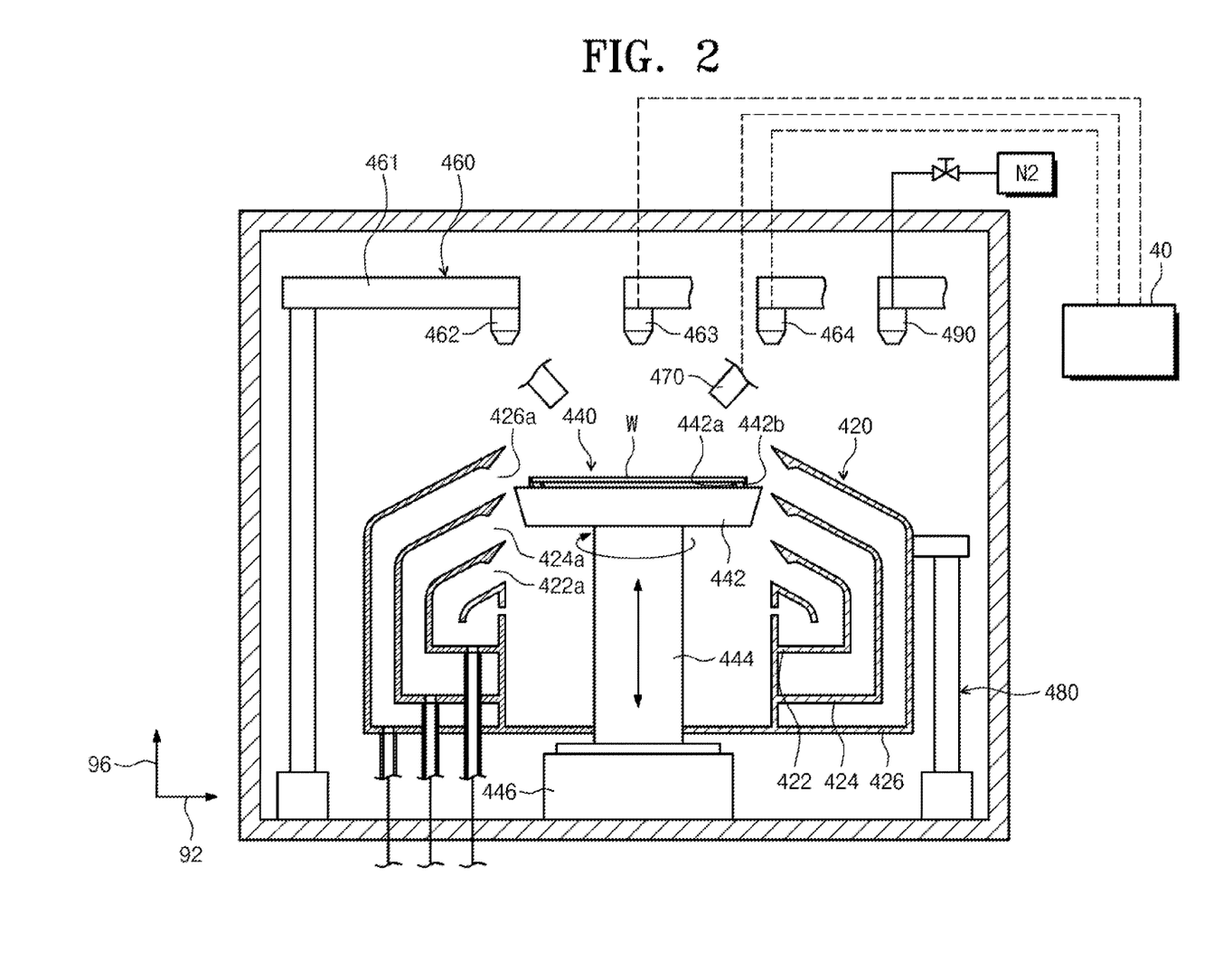
FIG. 2 is a view schematically showing an embodiment of a liquid treating chamber of FIG. 1.

FIG. 2 is a view schematically showing an embodiment of the liquid treating chamber 400 of FIG. 1. Referring to FIG. 2, the liquid treating chamber 400 has a housing 410, a cup 420, a support unit 440, a liquid supply unit 460, and an ascending and descending unit 480.

The housing 410 has a generally rectangular parallelepiped shape. The cup 420, the support unit 440, and the liquid supply unit 460 are received in the housing 410.

The cup 420 has a treating space with an open top. The substrate W is liquid-treated in the treating space. The support unit 440 supports the substrate W in the treating space. The liquid supply unit 460 supplies a liquid onto the substrate W supported on the support unit 440. Various types of liquid may be supplied sequentially onto the substrate W. The ascending and descending unit 480 adjusts a relative vertical spacing between the cup 420 and the support unit 440.

In one example, the cup 420 has a plurality of collection vessels 422, 424, and 426. Each of the collection vessels 422, 424, and 426 has a collection space for collecting the liquid used for substrate treatment. Each of the collection vessels 422, 424, and 426 has a ring shape surrounding the support unit 440. During the liquid treating process, the treating liquid scattered due to rotation of the substrate W is introduced into the collection space through inlets 422a, 424a, and 426a of the collection vessels 422, 424, and 426 respectively.

In one example, the cup 420 has a first collection vessel 422, a second collection vessel 424, and a third collection vessel 426. The first collection vessel 422 surrounds the support unit 440, the second collection vessel 424 surrounds the first collection vessel 422, and the third collection vessel 426 surrounds the second collection vessel 424. A second inlet 424a which introduces the liquid into the second collection vessel 424 is located above a first inlet 422a which introduces the liquid into the first collection vessel 422. A third inlet 426a which introduces the liquid into the third collection vessel 426 is located above the second inlet 424a.

The support unit 440 has a support plate 442 and a drive shaft 444. A top surface of the support plate 442 may have a generally circular shape and may have a diameter larger than that of the substrate W. A central region of the support plate 442 has a support pin 442a for supporting a rear surface of the substrate W. The support pin 442a protrudes upwards from the support plate 442 so that the substrate W is spaced, by a certain distance, from the support plate 442.

A chuck pin 442b is disposed at an edge of the support plate 442. The chuck pin 442b protrudes upward from the support plate 442, and supports a side portion of the substrate W so that the substrate W does not deviate from the support unit 440 when the substrate W is rotated. The drive shaft 444 is driven by a driver 446, and is connected to a center of a bottom surface of the substrate W, and rotates the support plate 442 about a central axis thereof.

The ascending and descending unit 480 is configured to move the cup 420 in a vertical direction. The vertical movement of the cup 420 changes the relative spacing between the cup 420 and the substrate W. As a result, the collection vessels 422, 424, and 426 for collecting the treating liquid are changed according to a type of liquid to be supplied to the substrate W, so that various liquids may be collected in a separate manner. Alternatively, the cup 420 may be fixedly installed, and the ascending and descending unit 480 may be configured to move the support unit 440 in the vertical direction.

In one example, the liquid supply unit 460 has a chemical supply unit 462, a first treating liquid supply unit 463 and a second treating liquid supply unit 464. The chemical supply unit 462 supplies various chemicals onto the substrate W. The chemical may refer to liquid having acid or base properties. For example, the chemical may include diluted sulfuric acid ($H_2SO_4$), phosphoric acid ($P_2O_5$), hydrofluoric acid (HF), and ammonium hydroxide ($NH_4OH$).

The first treating liquid supply unit 463 supplies a first treating liquid onto a treating target surface of the rotating substrate W. The first treating liquid may be a cleaning liquid that removes a film or foreign substances remaining on the substrate W.

The second treating liquid supply unit 464 supplies a second treating liquid onto the treating target surface of the rotating substrate W. The second treating liquid may be an organic solvent having a lower surface tension than that of the first treating liquid. When the second treating liquid is supplied to the substrate W coated with the first treating liquid, the first treating liquid on the substrate W may be replaced with the second treating liquid.

A vapor generation adjustment unit 470 supplies an evaporation inhibiting agent into the treating space. The evaporation inhibiting agent may be sprayed in a vapor state. In one embodiment, the evaporation inhibiting agent may have a surface tension greater than that of the second treating liquid. In one embodiment, the evaporation inhibiting agent may have the same surface tension as the first treating liquid, or a have a surface tension greater than that of the first treating liquid. In one embodiment, the evaporation inhibiting agent may be of the same type as the first treating liquid.

In one example, the first treating liquid may be DIW, the second treating liquid may be isopropyl alcohol (IPA), and the evaporation inhibiting agent may be water.

The chemical supply unit 462, the first treating liquid supply unit 463, and the second treating liquid supply unit 464 may be supported on different arms 461 respectively. These arms 461 may be configured to be moved independently. The vapor generation adjustment unit 470 may be positioned to supply the vapor from both sides above the substrate W onto the substrate W A controller 40 controls the first treating liquid supply unit 463, the second treating liquid supply unit 464, and the vapor generation adjustment unit 470.

Figure 3:
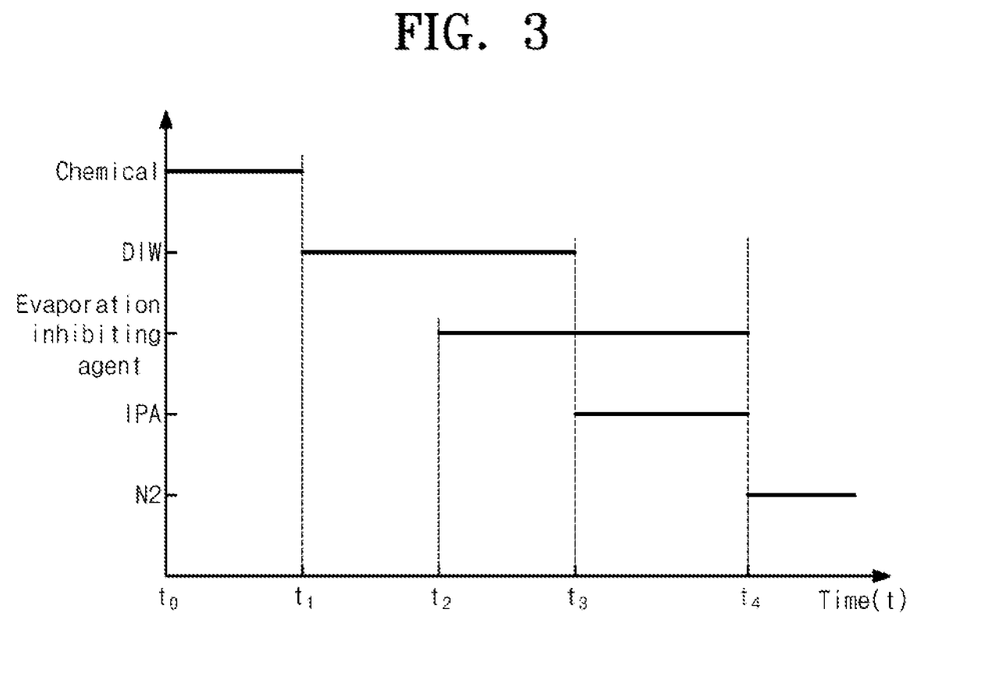
FIG. 3 is a graph schematically showing a liquid treating process sequence according to an embodiment of the inventive concept.

Next, a procedure for treating the substrate W with the treating liquid in the liquid treating chamber 400 will be described in detail. FIG. 3 is a graph showing an embodiment of the inventive concept in chronological order. FIG. 4 to FIG. 11 are drawings sequentially showing a cleaning procedure shown in FIG. 3.

Referring to FIG. 3, the chemical is supplied onto the substrate W for a time duration from t0 to t1, the DIW is supplied onto the substrate W for a time duration from t1 to t3, and the IPA is supplied onto the substrate W for a time duration from t3 to t4. The IPA is supplied before t3, so that the DIW supply time may overlap the IPA supply time. Herein, an example in which the IPA is supplied immediately after the DIW is supplied will be described. After t4, nitrogen gas is supplied onto the substrate. In addition, water vapor is supplied to the treating space for a duration from t2 to t4.

Hereinafter, the cleaning procedure will be described in detail with reference to FIG. 4 to FIG. 10.

Although not shown, initially, chemical is discharged from the chemical supply unit 462 onto the substrate W during a duration from t0 to t1, thereby to treat the substrate W using the chemical.

Figure 4:
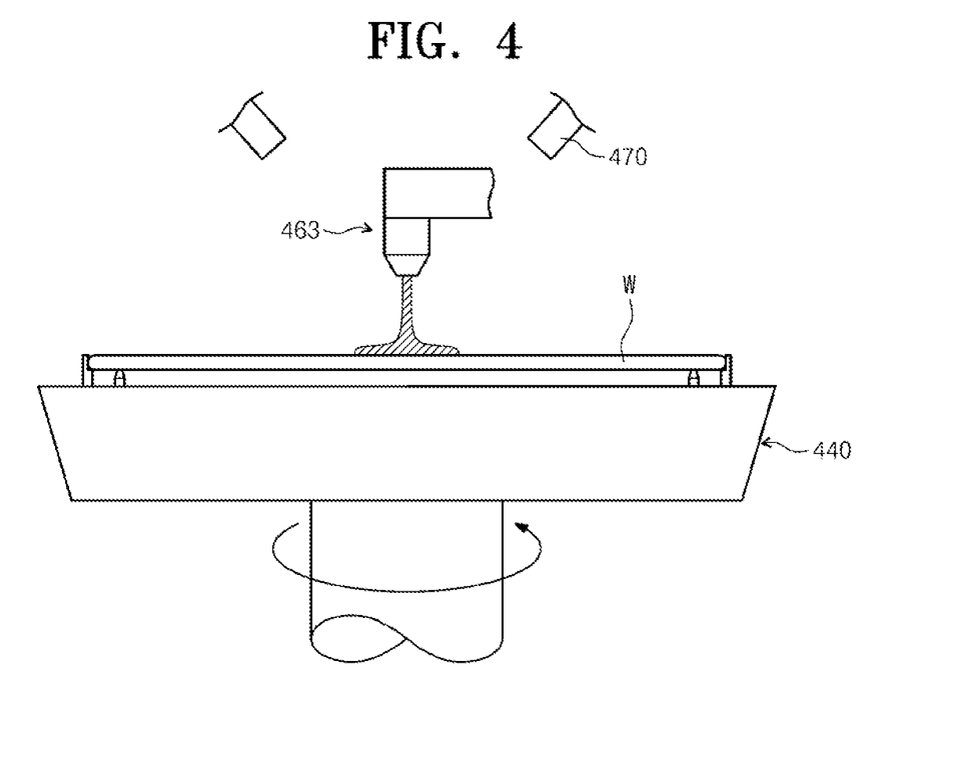
FIG. 4 to FIG. 11 are drawings sequentially showing a cleaning procedure according to FIG. 3, respectively.

Then, as shown in FIG. 4, at t1, the first treating liquid supply unit 463 discharges DIW to the treating target surface of the rotating substrate W. The first treating liquid supply unit 463 supplies DIW from a center above the substrate W onto the substrate W. DIW spreads throughout the substrate W using a centrifugal force as the substrate W rotates, thereby removing the chemical from the substrate W and forming a water-film on the substrate W.

Figure 5:
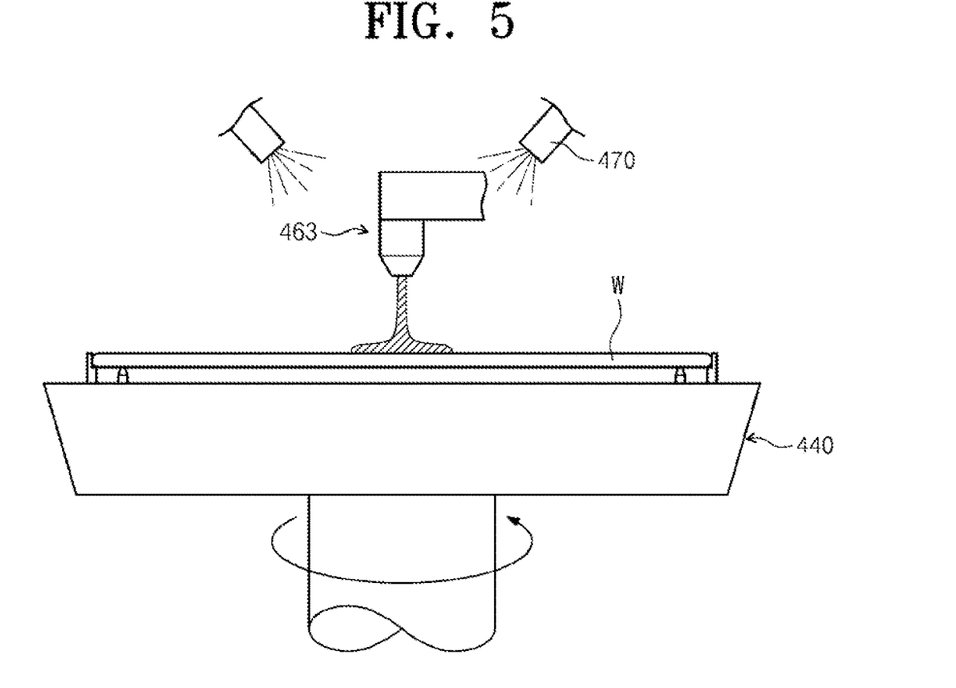

Then, as shown in FIG. 5, at t2, the water vapor is supplied from the vapor generation adjustment unit 470 toward the substrate W while DIW is discharged from the first treating liquid supply unit 463. Thus, a vapor atmosphere is created in a region above the substrate W, and a relative humidity increases around the water-film on the substrate W.

Figure 6:
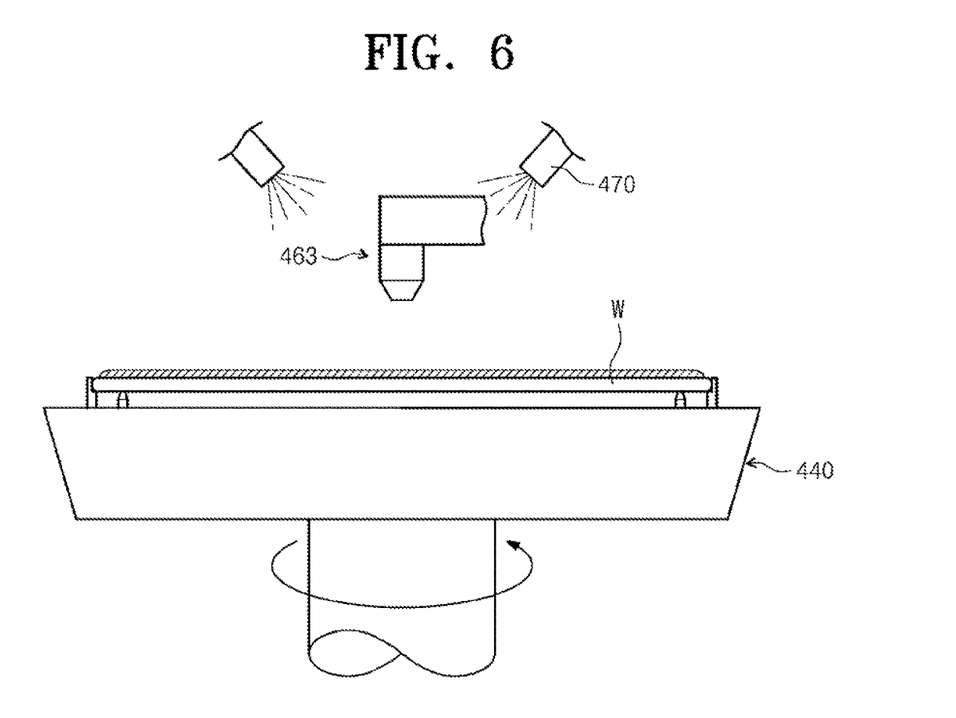

Then, as shown in FIG. 6, at t3, the supply of DIW onto the substrate W from the first treating liquid supply unit 463 stops. At this time, the water vapor may be continuously supplied from the vapor generation adjustment unit 470.

Figure 7:
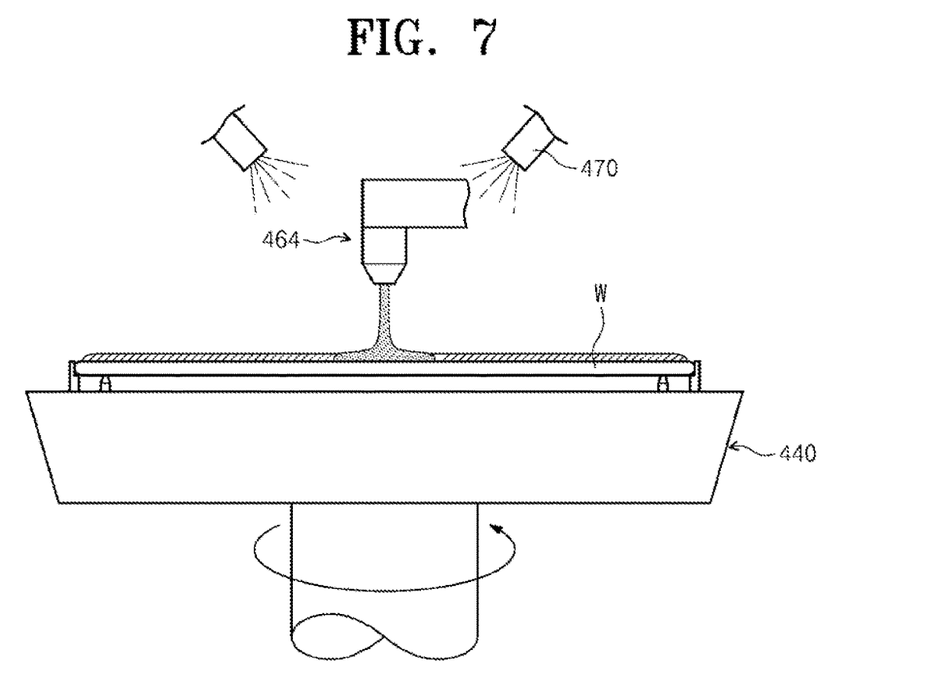

Further, as shown in FIG. 7, at t3, IPA is supplied from the second treating liquid supply unit 464 to the treating target surface of the substrate W on which the water-film is formed while the substrate W is continuously rotated. As IPA begins to be supplied onto the substrate W at t3, DIW begins to be replaced with IPA from a central region of the substrate W to an edge region thereof.

In general, because IPA evaporation occurs in a procedure where DIW is replaced with IPA, a phenomenon in which the liquid-film on the substrate W is destroyed may occur. However, in accordance with the present disclosure, the water vapor is supplied to a region around the water-film before IPA is injected from the second treating liquid supply unit 464. Thus, evaporation of IPA having a lower surface tension than that of water is suppressed due to high interfacial tension of the water vapor. Thus, the evaporation of IPA is suppressed in the procedure where DIW is replaced with IPA, thereby preventing the liquid-film on the substrate W from being destroyed.

As a relative humidity of the water vapor is higher, the evaporation of IPA on the substrate is more suppressed. Thus, the liquid-film destroying phenomenon is more effectively prevented when the relative humidity of the water vapor is increased. Thus, a vapor atmosphere may be formed around the liquid-film on the substrate W such that the relative humidity of the water vapor is close to 100%, or the relative humidity is 100%.

Moreover, when the evaporation inhibiting agent has a higher surface tension than that of IPA, evaporation of IPA may be further suppressed.

In one embodiment, the vapor generation adjustment unit 470 may form a vapor atmosphere in a region above the substrate W such that the relative humidity of the water vapor is 100% prior to t3. Moreover, the evaporation of IPA may be continuously suppressed by maintaining the relative humidity of the water vapor at 100% for a duration from t3 to t4.

In one example, the relative humidity in the treating space may be measured by a relative humidity measurement device (not shown) and the measured value may be transmitted to the controller 40. The controller 40 may control the second liquid supply unit 464 so that the supply of IPA starts when the relative humidity of the water vapor reaches 100%.

Figure 8:
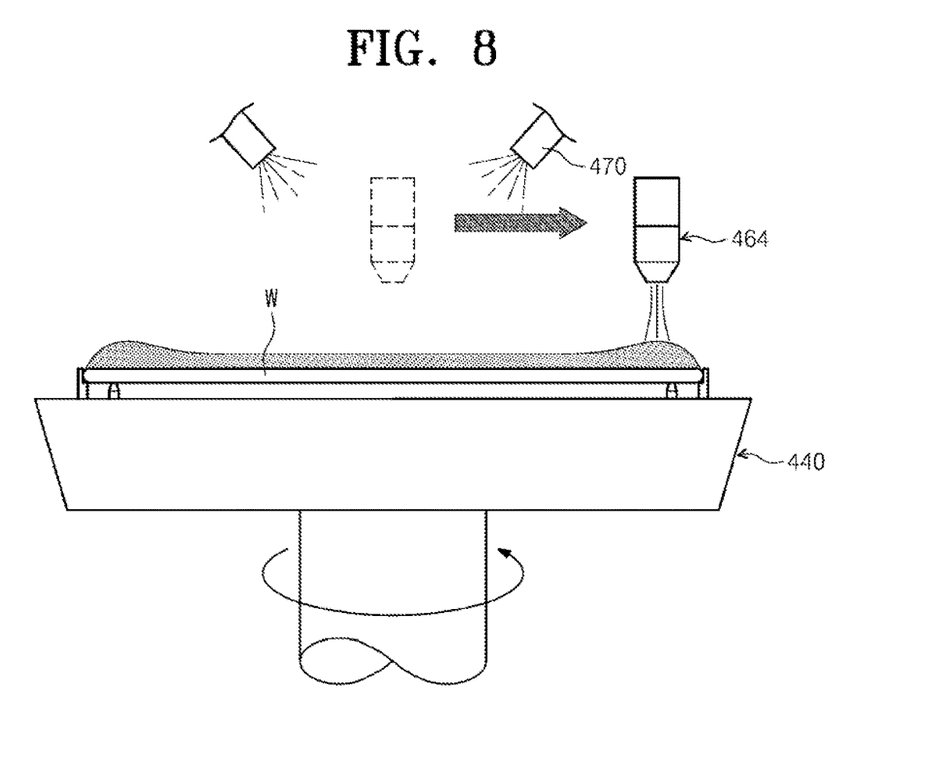

While IPA is being supplied to the substrate W, the second treating liquid supply unit 464 may move from a central region of the substrate W to the edge region thereof as shown in FIG. 8, thereby to change a collision point of IPA on the substrate W. That is, the second treating liquid supply unit 464 may be located in a central region above the substrate W at t4 and may move to be located in an edge region above the substrate W at t4. Optionally, for a duration from t3 to t4, the second treating liquid supply unit may reciprocate once or multiple times between the central region above the substrate W and the edge region above the substrate W.

Figure 9:
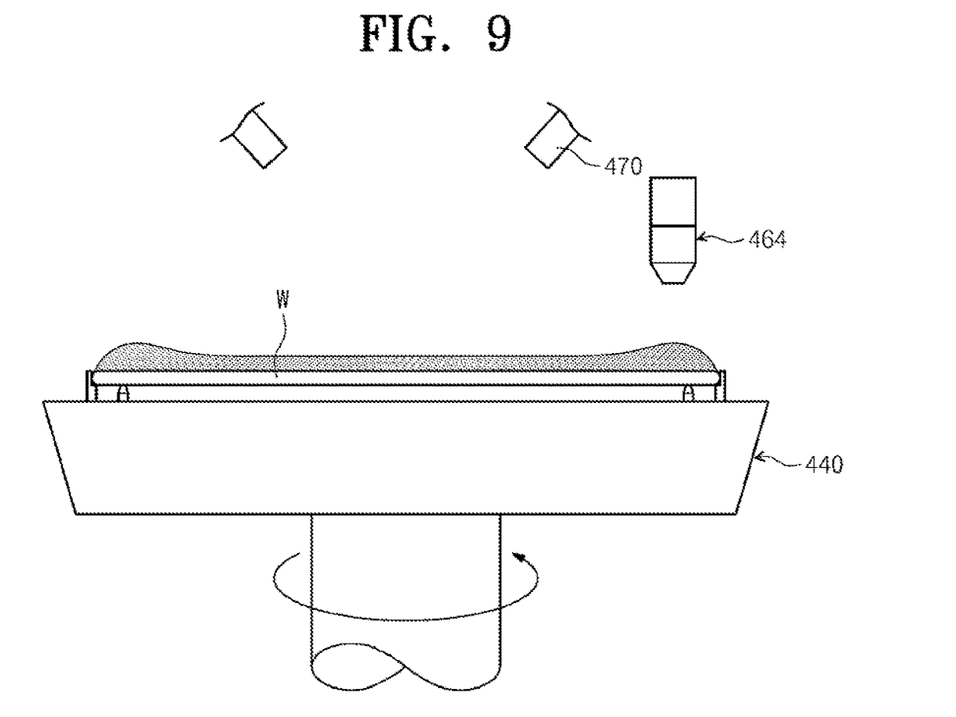
Figure 10:
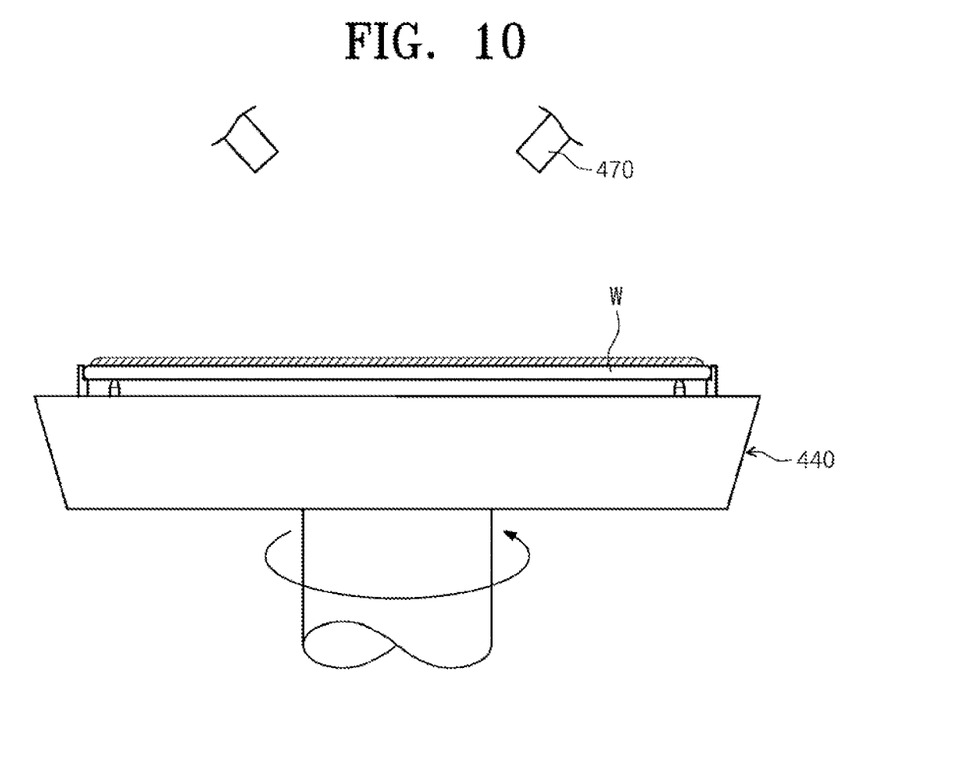
Figure 11:
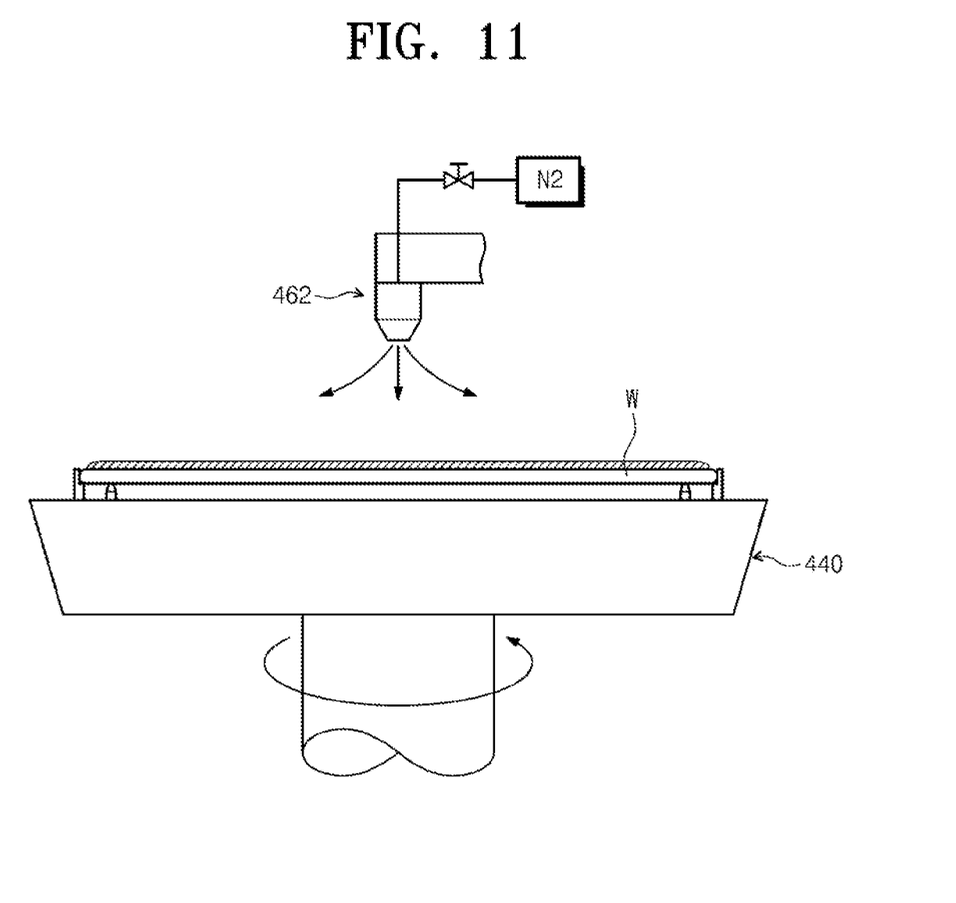

When a current time reaches t4 and thus the first treating liquid is completely replaced with the second treating liquid, the IPA supply and the water vapor supply are terminated as shown in FIG. 9. As shown in FIG. 10, an IPA liquid-film is present on the substrate W. Then, as shown in FIG. 11, at t4, a drying process of evaporating IPA on the substrate W is started.

During the drying process, an inert gas may be supplied from a gas supply unit 490 to the substrate W. In one example, the inert gas may be nitrogen.

Next, another embodiment of the inventive concept will be described.

Figure 12:
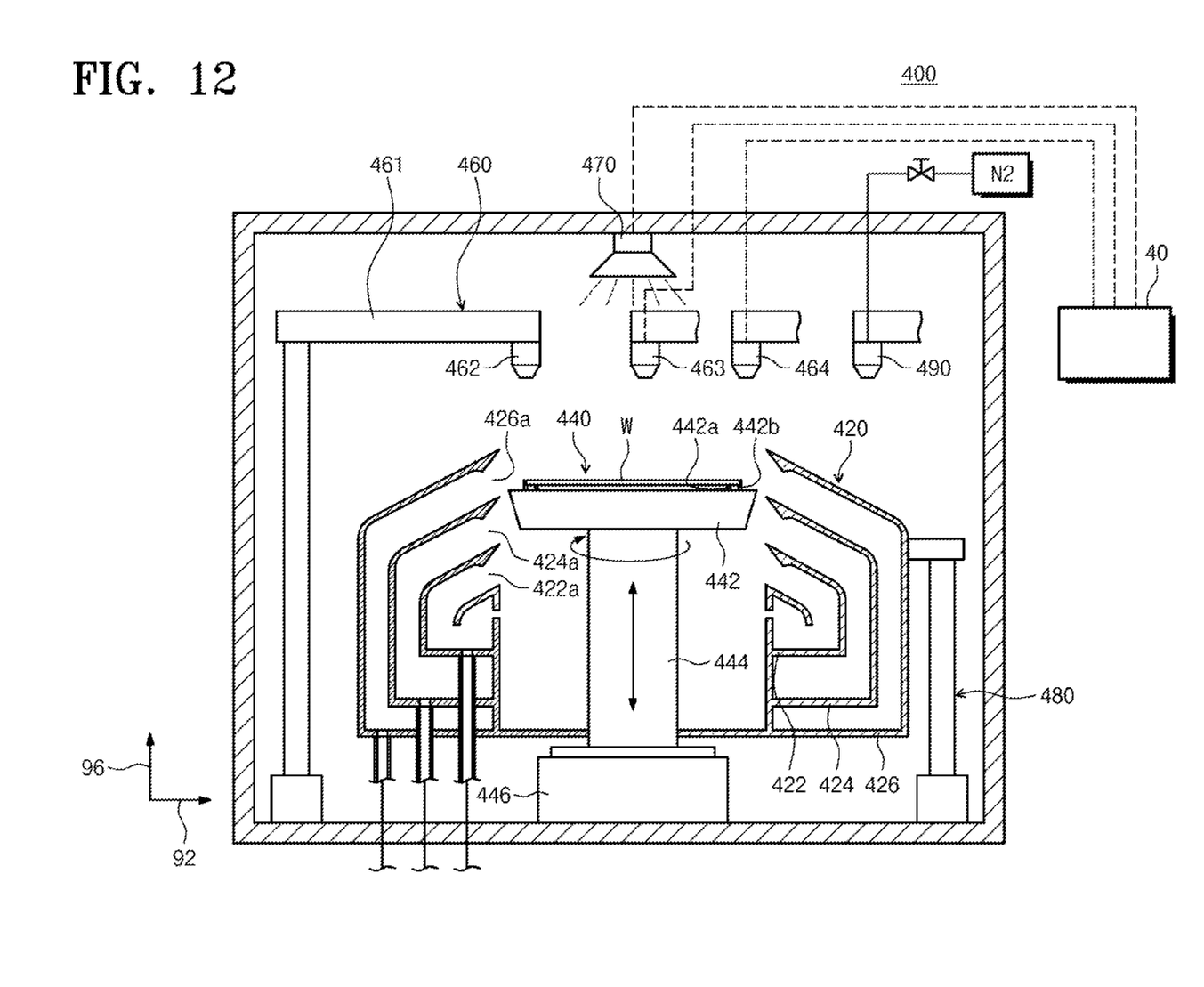
FIG. 12 is a view schematically showing a variant of a liquid treating chamber of FIG. 11

In the above-described example, the vapor generation adjustment unit is embodied to have a nozzle shape. Alternatively, the vapor generation adjustment unit 470 may be embodied to have a diffuser shape as shown in FIG. 12.

In the above-described example, the second treating liquid supply unit 464 supplies IPA onto the substrate W while changing the collision point of the IPA thereon. Alternatively, the second treating liquid supply unit 464 may be configured to supply the second treating liquid from the central region above the substrate W onto the substrate W for a duration from t3 to t4 of FIG. 4 while fixing the collision point of the IPA thereon.

In the above-described example, the second treating liquid supply unit 464 supplies IPA onto the substrate W while changing the collision point of the IPA thereon. Alternatively, the second treating liquid supply unit 464 may be configured to supply the second treating liquid onto the central region of the substrate W while fixing the collision point of the IPA thereon.

In the above-described example, the discharge of the evaporation inhibiting agent is started while the first treating liquid is being discharged.

Figure 13:
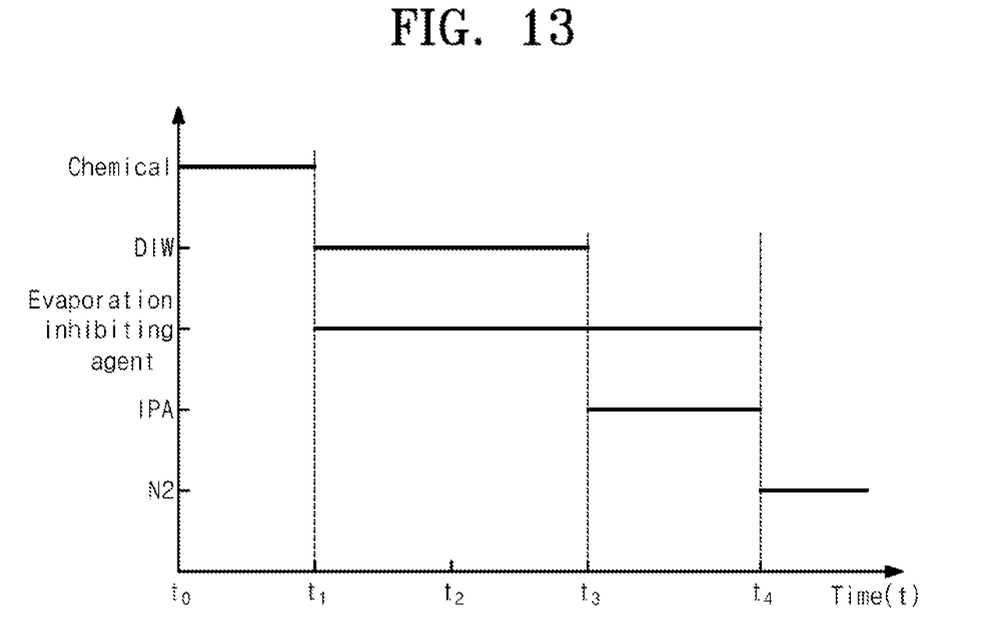
FIG. 13 to FIG. 16 are graphs schematically showing a sequence of a liquid treating process according to a variant of the inventive concept.
Figure 14:
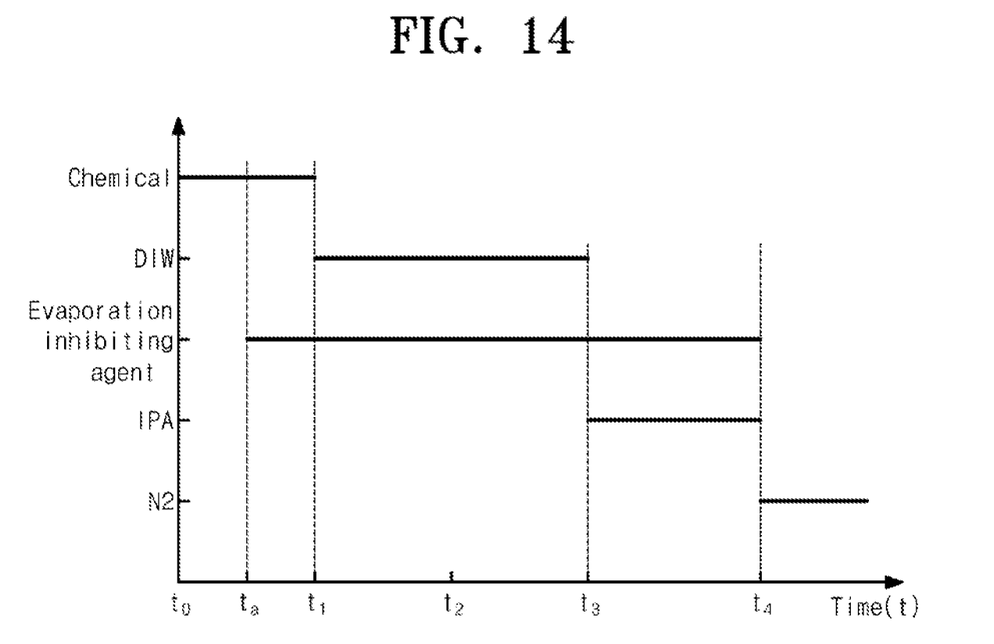

Alternatively, as shown in FIG. 13, the evaporation inhibiting agent may be discharged to the treating space at t1 when the first treating liquid is discharged. Alternatively, as shown in FIG. 14, the evaporation inhibiting agent may be discharged at to before the first treating liquid is discharged.

Moreover, in the above-described example, the discharge of the second treating liquid is terminated and, at the same time, the discharge of the evaporation inhibiting agent is terminated.

Figure 15:
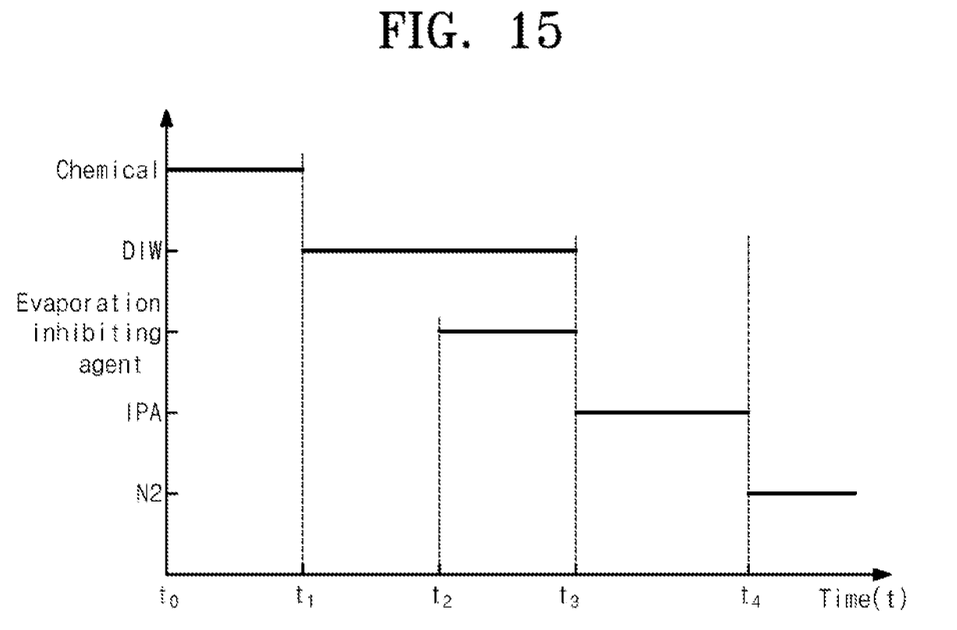
Figure 16:
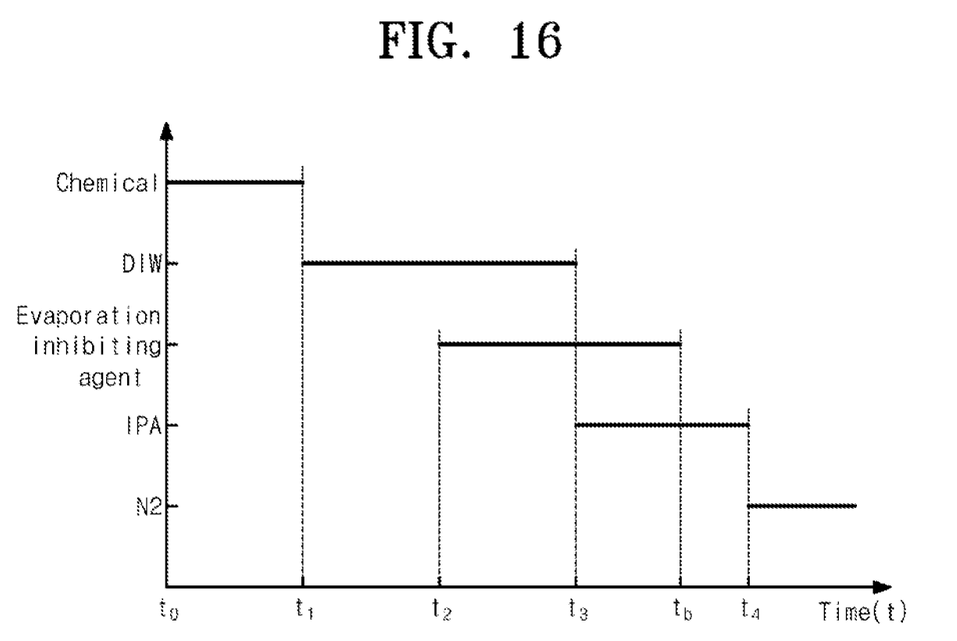

Alternatively, as shown in FIG. 15, the discharge of the evaporation inhibiting agent may be terminated at t3 before the second treating liquid is discharged. Alternatively, as shown in FIG. 16, the discharge of the evaporation inhibiting agent may be terminated at tb during the second treating liquid is being discharged.

According to one embodiment of the inventive concept, the vapor atmosphere may be formed around the cleaning liquid applied to the substrate. Thus, the liquid-film destroying phenomenon may be prevented in the procedure in which the cleaning liquid is replaced with the organic solvent.

Moreover, according to an embodiment of the inventive concept, the leaning or particle contamination may be suppressed to improve a production yield of the substrate.

The effect of the inventive concept is not limited to the above-described effects. Effects not mentioned will be clearly understood by those skilled in the art from the present specification and the accompanying drawings.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
    a housing having a treating space defined in the housing;
    a support unit for supporting the substrate in the treating space;
    a first treating liquid supply unit for supplying a first treating liquid to a treating target surface of the substrate supported on the support unit;
    a second treating liquid supply unit for supplying a second treating liquid having a surface tension lower than a surface tension of the first treating liquid to the treating target surface of the substrate supported on the support unit;
    a vapor generation adjustment unit for spraying an evaporation inhibiting agent in a vapor state into the treating space; and
    a controller connected to the first treating liquid supply unit, the second treating liquid supply unit, and the vapor generation adjustment unit, the controller configured to:
        control the first treating liquid supply unit to supply the first treating liquid to the treating target surface for a first time duration,
        while supplying the first treating liquid, control the vapor generation adjustment unit to supply the evaporation inhibiting agent in the vapor state to the treating space for a second time duration that overlaps with the first time duration, and
        while supplying the evaporation inhibiting agent, control the second treating liquid supply unit to supply the second treating liquid, for a third time duration that overlaps with the second time duration, to the treating target surface on which the first treating liquid has been present such that the first treating liquid on the treating target surface is replaced with the second treating liquid.

2. The apparatus of claim 1, wherein the first treating liquid is distilled water (DIW), the second treating liquid is an organic solvent, and the evaporation inhibiting agent is water.

3. The apparatus of claim 1, wherein a surface tension of the evaporation inhibiting agent is greater than a surface tension of the second treating liquid.

4. The apparatus of claim 1, wherein a surface tension of the evaporation inhibiting agent is equal to or greater than a surface tension of the first treating liquid.

5. The apparatus of claim 1, wherein the evaporation inhibiting agent is the same type as the first treating liquid.

6. The apparatus of claim 1, wherein during the overlap of the second time duration and the third time duration, the controller is further configured to:
    control the vapor generation adjustment unit to maintain a relative humidity of the evaporation inhibiting agent in the treating space at 100% by supplying the evaporation inhibiting agent in the vapor state to the treating space, and
    control the second treating liquid supply unit to supply the second treating liquid while the relative humidity is maintained at 100%.

7. The apparatus of claim 1, further comprising a relative humidity measurement device for measuring a relative humidity of the treating space in the housing.

8. The apparatus of claim 1, wherein the second time duration is longer than the third time duration and the second time duration includes all of the third time duration.

9. The apparatus of claim 1, wherein the controller is configured to:
    before starting supplying the first treating liquid, start the control of the vapor generation adjustment unit to supply the evaporation inhibiting agent in the vapor state to the treating space.

10. The apparatus of claim 1, further comprising a chemical supply unit for supplying a chemical to the treating target surface of the substrate,
    wherein the controller is further configured to:
        control the chemical supply unit to supply the chemical to the treating target surface for a fourth time duration, and
        while supplying the chemical to the treating target surface, start the control the vapor generation adjustment unit to supply the evaporation inhibiting agent in the vapor state to the treating space,
    wherein the second time duration overlaps with the fourth time duration and the second time duration comprises all of the first time duration and all of the third time duration.

* * * * *